United States Patent [19]
Moody et al.

[11] Patent Number: 5,694,038
[45] Date of Patent: Dec. 2, 1997

[54] DETECTOR OF PASSING MAGNETIC ARTICLES WITH AUTOMATIC GAIN CONTROL

[75] Inventors: Kristann L. Moody, Barrington; Ravi Vig, Bow; P. Karl Scheller, Rochester; Jay M. Towne, Andover; Teri L. Tu, Bow, all of N.H.

[73] Assignee: Allegro Microsystems, Inc., Worcester, Mass.

[21] Appl. No.: 587,406

[22] Filed: Jan. 17, 1996

[51] Int. Cl.$^6$ .............................. G01B 7/30; G01P 3/489; F02P 17/02; H03G 1/00

[52] U.S. Cl. ................... 324/207.2; 123/146.5 A; 324/166; 324/207.12; 324/251; 327/179; 327/332; 327/511

[58] Field of Search ..................... 324/166, 173, 324/174, 207.12, 207.2, 207.21, 207.25, 207.26, 251, 252; 123/146.5 A, 612, 617; 327/179, 306, 331, 332, 510, 511; 307/116, 117; 330/86, 278, 279, 282

[56] References Cited

U.S. PATENT DOCUMENTS

| | | | |
|---|---|---|---|
| 4,185,265 | 1/1980 | Griffen et al. | 324/251 X |
| 4,293,814 | 10/1981 | Boyer | 324/207.2 X |
| 4,476,901 | 10/1984 | Sainen . | |
| 4,906,928 | 3/1990 | Gard | 324/240 |
| 5,442,283 | 8/1995 | Vig et al. | 324/207 |

OTHER PUBLICATIONS

An Engineering Approach to Digital Design, William I. Fletcher, pp. 14–19, Prentice Hall,Inc.,1980.
Data Acquisition and Conversion Handbook; pp. 16–17, Datel–Intersil,Inc.; Mansfield, Massachusetts; 1980.

*Primary Examiner*—Gerard R. Strecker

[57] ABSTRACT

A magnetic-field-to-voltage transducer includes a Hall element and a digitally gain-controlled Hall-voltage amplifier that produces an analog voltage Vsig having excursions of one polarity corresponding to the passing of magnetic articles. Vsig is applied to the input of a signal-manipulating circuit that generates a proximity- detector binary output voltage, Vout, having transitions of one direction each time a predetermined point is reached in Vsig. A digitally gain-controlled gain amplifier is connected to the Hall element. A comparator circuit generates a binary signal Vbig (or $V_{toobig}$) that changes from one to another binary level each time that Vsig exceeds a DC target voltage, $V_{TG}$. The AGC circuit senses and counts gain counter excursions of one polarity in Vsig, and produces a binary count output signal at the input of the gain amplifier at each of the counted excursions in Vsig, incrementally changing the transducer gain in the direction to bring the peaks in Vsig to just below the target value $T_{TG}$. This AGC feature prevents saturating the amplifier and quickly renders a Vsig of essentially constant amplitude so that either the peak excursion values or predetermined threshold levels in Vsig, at which transitions in the proximity detector output voltage Vout are caused to occur, provide greater accuracy and stability in the correlation between detection-approach and -withdrawal distances and transitions in Vout.

9 Claims, 7 Drawing Sheets

DETECTOR OF PASSING MAGNETIC ARTICLES WITH AUTOMATIC GAIN CONTROL

BACKGROUND

This invention relates to a proximity detector, and especially to a ferrous-gear-tooth Hall-transducer, or other magnetic-field-to-voltage transducer, capable of detecting the leading and trailing gear tooth edges of an adjacent rotating ferrous gear, or other magnetic articles, and more particularly relates to such a Hall proximity detector with an automatic gain adjust feature in the Hall-voltage amplifier.

The term "magnetic article" as used herein applies to magnetized bodies, ferrous bodies and other bodies having a low magnetic reluctance that tend to alter the ambient magnetic field.

In the U.S. Pat. No. 5,442,283, issued Aug. 15, 1995 there is described a Hall-voltage slope-activated proximity-detector capable of detecting the rising and falling edges of an adjacent rotating gear tooth. This proximity-detector type detector includes an integrated circuit Hall detector mounted to a pole of a magnet, and includes a circuit for tracking a slope of a Hall voltage (e.g. corresponding to the approach of a passing gear tooth) and briefly holding the ensuing peak voltage before producing an output signal indicating the onset of the following Hall-voltage slope of opposite direction (e.g. corresponding to the approach of a valley between two gear teeth). The Hall voltage holding circuit includes a capacitor and circuit means for controllably leaking charge out of or into the capacitor for preventing false tripping of a comparator that provides the pulse output signal.

The holding voltage of the capacitor thus has a droop which leads to increasing loss of holding accuracy as the speed of gear tooth passage becomes slower, and therefore the detector has a minimum gear teeth speed at which accurate detection is possible.

Most proximity detectors of the prior art produce a high binary output voltage indicating approach and proximity of a passing article, and produce a low binary voltage when the article recedes from the detector. The transition in detector output voltage from low to high typically is triggered by a comparator that determines when the transducer voltage rises to a fixed internal threshold voltage reference. Alternatively, in the case of the above described slope-activated detector, the detector determines when a transducer voltage peak has just occurred and the transducer signal voltage drops a predetermined incremental voltage from the peak value.

Prior art proximity detectors having fixed threshold voltages, produce low to high (or high to low) binary transitions in the output signal indicating approach of a magnetic article. In practice, the closest passing distance (sometimes referred to as the air gap) does not remain constant.

Variations of the air gap dimension causes shifts in the actual distances of article approach and receding at which the transducer voltages exceeds or falls below the fixed thresholds. This results in a lack of accuracy of passing detection that may rule out their use as position detectors of passing articles such as cams and gear teeth.

Changes in the air gap, between passing articles to be detected and the transducer, may be attributable to mechanical and electrical properties of the detector as well as in the properties of the passing articles, especially as a function of temperature.

The result is a detection inaccuracy that may rule out the use of such detectors for such critical applications as in combustion-engine ignition distributors. Prominent causes of this inaccuracy stem from the fact that the amplitude of the Hall voltage changes when gear teeth (articles) have different ferro- magnetic properties from tooth to tooth, and/or when undulating changes in the spacings (air gap) of gear teeth to detector are caused by eccentricity of the gear. Also, changes in temperature cause changes in air gap dimensions and in the sensitivity of the transducer and transducer-voltage amplifier.

Whether detection is accomplished by sensing the Hall voltage peaks or using a voltage threshold criteria for indicating approach of a passing article, changes in the median amplitude of the transducer voltage degrade the accuracy of position detection.

It is an object of this invention to provide a proximity detector, capable of detection at down to zero speeds, that generates a binary output voltage wherein the transitions therein more accurately correspond to a definite predictable point of approach and a definite point of receding of a passing magnetic article with respect to the proximity-detector transducer.

It is a further object of this invention to provide such a magnetic article proximity detector that automatically adjusts the gain of the magnetic-field-to-voltage transducer to a predetermined narrow range so that the amplitudes and slopes of the amplified transducer voltage remain substantially constant with changes in temperature and in the air gap dimensions between the transducer and the passing magnetic articles being detected.

It is yet an object of this invention to provide such a detector that at start up quickly adjusts the gain of the transducer-voltage amplifier, even within the time of passage of only a few of the passing magnetic articles being detected, so that excepting for only that few first articles the accuracy of detection will be excellent.

SUMMARY OF THE INVENTION

A proximity-detection method for detection of passing magnetic articles includes employing a digitally gain-controlled magnetic-field-to-voltage transducer, sensing an ambient magnetic field and generating a voltage, Vsig, having an amplitude that is directly related to the magnetic field. The amplitudes of the excursions of at least one polarity in Vsig are then compared to a predetermined target value, a binary signal Vbig is generated that changes from one to another binary level each time that Vsig exceeds the target value, and the binary signal is applied to the digitally-gain-controlled transducer. When Vbig changes from the one to another binary level the gain of the digitally-gain-controlled amplifier is changed by one predetermined gain increment in the direction to bring the peak values in Vsig to just below the predetermined target value. A binary proximity-detector output voltage Vout is generated having transitions of one polarity each time excursions of one polarity in Vsig reach a predetermined point therein.

A proximity detector of passing magnetic articles includes a magnetic-field-to-voltage transducer for sensing an ambient magnetic field and generating a voltage, $V_H$, having an amplitude that is directly related to the magnetic field. A digitally gain-controlled amplifier is connected to the transducer for amplifying $V_H$. A DC voltage source is provided for generating a target-voltage $V_{TG}$, and a comparator means has inputs connected to the output of the amplifier and to a DC reference voltage for generating a binary signal Vbig that changes from one to another binary level each time that Vsig exceeds $V_{TG}$.

A circuit means is connected to the output of the amplifier for sensing and counting the excursions of the one polarity in Vsig, and for producing a binary count output signal. The output of the circuit means is connected to the amplifier and the circuit means is additionally for at each of the counted excursions in Vsig, incrementally changing the transducer gain in the direction to bring the peaks in Vsig to just below the target value $T_{TG}$. This proximity detector also includes a circuit means connected to the output of the amplifier for generating a proximity-detector output voltage, Vout, having transitions of one polarity each time excursions of the one polarity in Vsig reach a predetermined point therein.

A proximity-detection method for detection of passing magnetic articles begins by sensing an ambient magnetic field and generating a voltage, $V_H$, having an amplitude that is directly related to the magnetic field. The voltage $V_H$ is amplified in a digitally-gain-controlled amplifier to generate an amplified signal Vsig. The following steps include comparing the amplitudes of the excursions of at least one polarity in Vsig to a predetermined target value, generating a digital signal that changes from one to another binary level when Vsig exceeds the target value, applying the digital signal to the digitally-gain-controlled amplifier and changing the gain of the digitally-gain-controlled amplifier in the direction to bring the peak values in Vsig to just below the predetermined target value. Finally a binary proximity-detector output voltage Vout is generated having transitions of one polarity each time excursions of one polarity in Vsig reach a predetermined point therein.

It is preferable that the generation of Vout be accomplished by a slope-activated proximity detector method such as those described in the co-filed patent application Ser. No. 08/587,405 entitled DETECTION OF PASSING MAGNETIC ARTICLES AT SPEEDS DOWN TO ZERO AND CIRCUIT THEREFOR or the above-noted U.S. Pat. No. 5,442,283.

The comparing the amplitudes of the excursions of at least one polarity in Vsig, and the generating a digital signal for incrementally changing the gain of the digitally-gain-controlled amplifier, may only be for one initial predetermined interval. Each incremental change in gain is preferably a fixed predetermined increment of gain change.

There may be added the steps of counting the excursions of at least one polarity and terminating the one initial predetermined interval when the count reaches a predetermined number.

BRIEF DESCRIPTION OF THE DRAWINGS

FIGS. 3, 4, 5, 6, 7 and 8 are drawn to the same time scale as that of FIG. 2.

FIGS. 10, 11 and 12 are drawn to the same time scale as that of FIG. 9.

FIGS. 14, 15, 16, 17 and 18 relate to the proximity detector of FIG. 13 and are all drawn to the same time scale.

DESCRIPTION OF PREFERRED EMBODIMENTS

Figure 1:
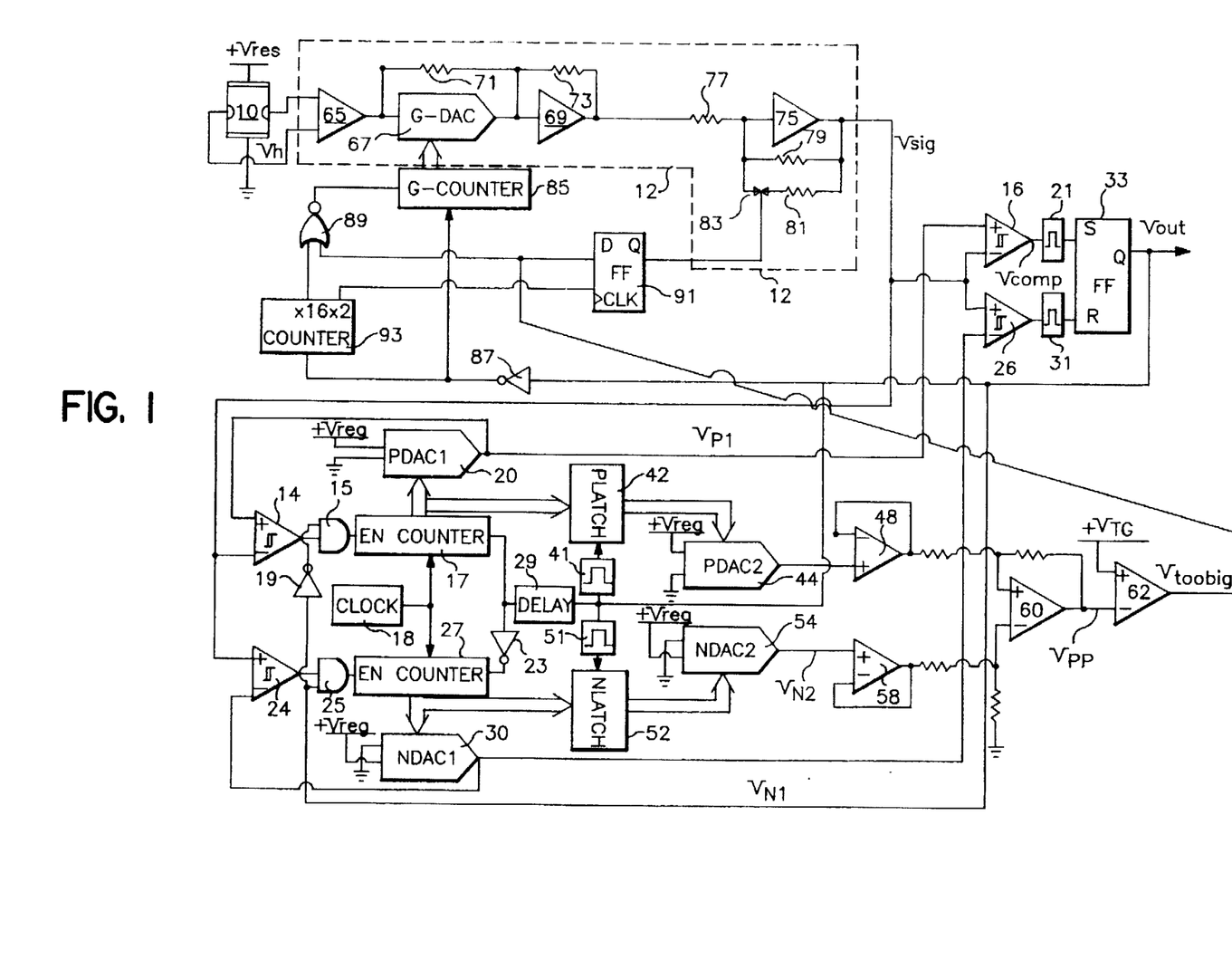
FIG. 1 shows a block diagram of a first magnetic-article proximity detector of this invention.

The Hall element 10 of FIG. 1 has an output connected to the input of a Hall voltage amplifier 12. Hall element 10 may mounted at a pole of a magnet (not shown), so that when a ferrous article approaches, the Hall voltage $V_H$ and thus the amplified Hall voltage Vsig increase (or decrease). When the article recedes, $V_H$ and Vsig decrease (or increase depending upon the polarity of the magnet pole). Alternatively, the detector circuit of FIG. 1 may be used to detect magnetic articles that themselves are magnetized, in which case the Hall element need not be mounted with a magnet.

A magneto resistors bridge (not shown) may be substituted for the Hall element. And two Hall elements with their outputs connected differentially to the input of the Hall voltage amplifier (not shown) represents a second alternative magnetic-field-to-voltage transducer.

The amplified Hall voltage, Vsig, is manipulated by the remaining circuits in the proximity detector of FIG. 1 to produce a square wave proximity-detector output signal, Vout, that like a shadow graph reflects the profile of the passing articles.

The amplified Hall voltage Vsig is applied to the positive input of a first comparator 14, and is also applied to the negative input of a second comparator 16. The amplified Hall voltage Vsig is further applied to the negative input of the other first comparator 24 and to the plus input of the other second comparator 26.

Assuming, as a starting point, that the counter 17 is at zero count, when the output of the first comparator 14 goes high the counter 17 begins counting the clock pulses from clock 18. The resulting count is presented to the digital-to-analog converter (PDAC1) 20 which produces an output analog voltage $V_{P1}$ always lying somewhere within the range from zero to the DC supply voltage, +Vreg. At any instant the amplitude of $V_{P1}$ is a direct linear function of the count signal from counter 17. When power is first applied to the detector circuit, a logic block (not shown) senses the time of turning on of the DC supply voltage, +Vreg, and resets the counters to zero count.

Figure 2:
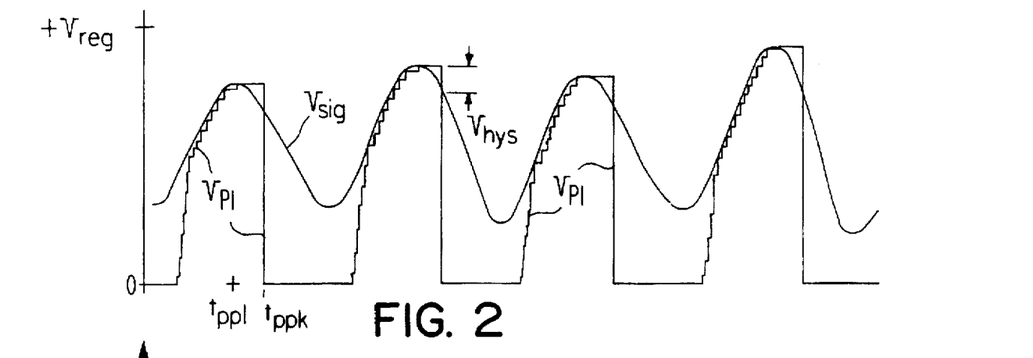
FIG. 2 shows a waveform of the Hall (transducer) voltage signal, during passage of four magnetic articles, superimposed on a waveform of the output voltage signal $V_{P1}$ from the PDAC1.

The comparator 14 has hysteresis and so is a Schmitt type comparator. The output of the DAC 20 (PDAC1) is connected to the negative input of the comparator 14 so that whenever Vsig becomes greater than voltage $V_{P1}$ plus the small hysteresis threshold voltage of the comparator 14, then the comparator 14 output goes high. If at that time Vout is low, then the outputs of invertor 19 and AND gate 15 goes high and the counter 17 is enabled and counting. When Vsig is growing more positive, $V_{P1}$ is caused to track Vsig in stair step fashion, as is illustrated in FIG. 2. The incremental vertical excursions of the stair stepped $V_{P1}$ are equal to Vreg/$2^n$, where n is the number of DAC bits. The incremental horizontal times, $\Delta t1$, increase as the slope of Vsig decreases.

Figure 4:
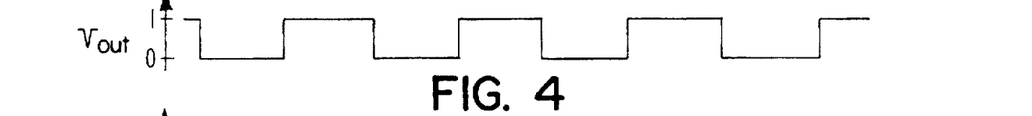
FIG. 4 shows a waveform of output voltage, Vout, of the proximity-detector of FIG. 1.

As is illustrated in FIG. 2, when a peak positive voltage of Vsig is reached, the counter 17 stops counting at a time $t_{pp1}$, and $V_{P1}$ holds this peak voltage until time $t_{ppk}$. At time $t_{ppk}$, Vsig falls below the held voltage $V_{P1}$ by an amount Vhys equal to the threshold of comparator 16, and the output of comparator 16 goes high briefly setting the flip flop 33 so that Vout goes from low to high, as seen in FIG. 4. The pulse expander circuits 21 and 31, shown as one-shot pulse generators in FIG. 1, have their inputs respectively connected to the outputs of comparators 16 and 26, and have their outputs respectively connected to the set and reset inputs of flip flop 33.

Figure 5:
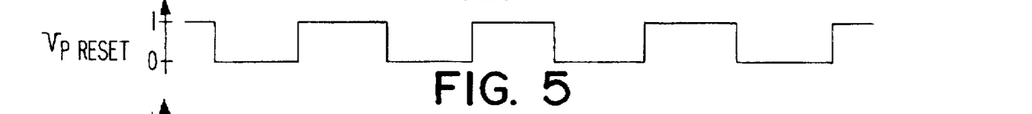
FIG. 5 shows a waveform of the reset signal to the counter 17 in the proximity-detector of FIG. 1.
Figure 6:
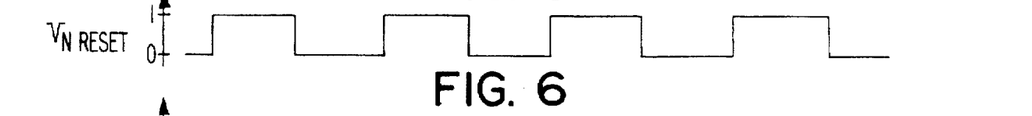
FIG. 6 shows a waveform of the reset signal to the counter 27 in the proximity-detector of FIG. 1.

Vout is applied to the reset input of the counter 17 via a delay circuit 29, resetting and holding the count in counter 17 to zero at time $t_{ppk}$ (FIG. 5) for as long as the reset signal $V_{Preset}$ is high; thus $V_{P1}$ remains at zero volts for that time also. At a subsequent positive pulse in the signal Vsig, $V_{P1}$ again begins to track the subsequent positive pulse to its peak and to hold that new peak voltage. The reset signal (FIG. 6) resets the counter 27 via invertor 23 at times $t_{npk}$ and holds reset for as long as the reset signal $V_{Nreset}$ is high.

Figure 3:
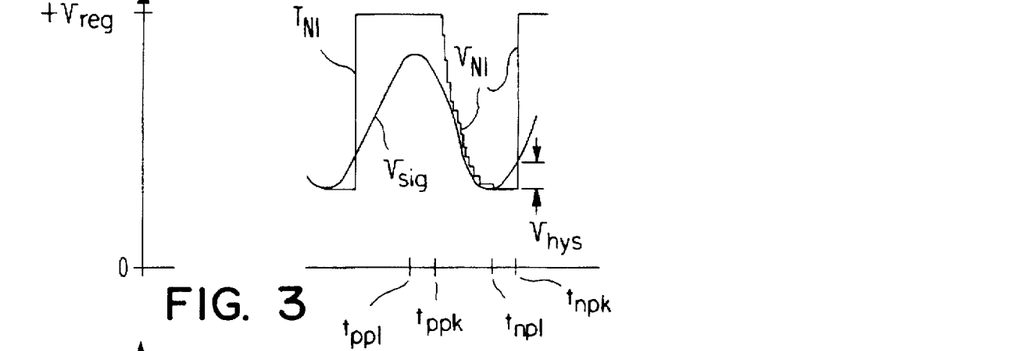
FIG. 3 shows a partial waveform of the output voltage signal $V_{N1}$ from the NDAC1 in FIG. 1.

A lower (N) circuit portion in the proximity detector of FIG. 1 essentially mirrors the construction of the upper (P) portion just described. The lower circuit portion manipulates the negative pulses in Vsig in the same way as does the upper portion with respect to positive pulses in Vsig. For example, as is illustrated in FIG. 3, when a peak negative voltage of Vsig is reached, the counter 27 stops counting at a time $t_{np1}$, and $V_{N1}$ holds this peak voltage until time $t_{npk}$. At time $t_{npk}$, Vsig falls below the held voltage $V_{N1}$ by an amount Vhys equal to the threshold of comparator 26, and the output of comparator 26 goes high to reset the flip flop 33 so that Vout goes from high to low, as seen in FIG. 4.

The part of the proximity detector of FIG. 1 described above operates in a digital peak detecting mode. Such a detector is the subject of a patent application, Ser. No. 08/587,405 entitled DETECTION OF PASSING MAGNETIC ARTICLES AT SPEEDS DOWN TO ZERO, that is assigned to the same assignee as is the current application and is filed concurrently herewith. That application describes the proximity detector circuit and operation in greater detail and is incorporated by reference herein.

The remainder of the circuit in FIG. 1 relates to circuitry for the automatic gain control circuit of the Hall voltage.

Figure 7:
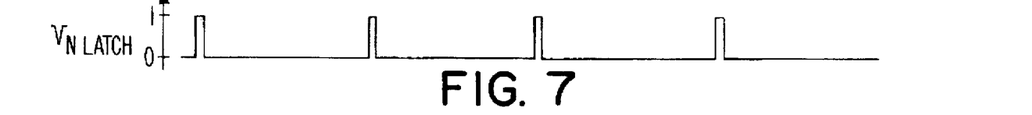
FIG. 7 shows a waveform of the latch enable signal to the N latch 52 in the proximity-detector of FIG. 1.
Figure 8:
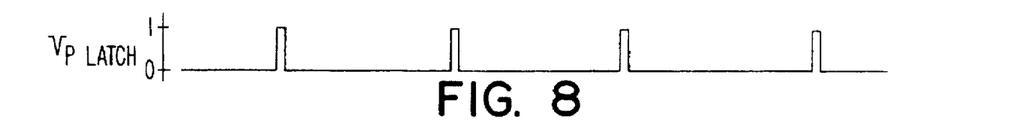
FIG. 8 shows a waveform of the latch enable signal to the P latch 42 in the proximity-detector of FIG. 1.
Figure 9:
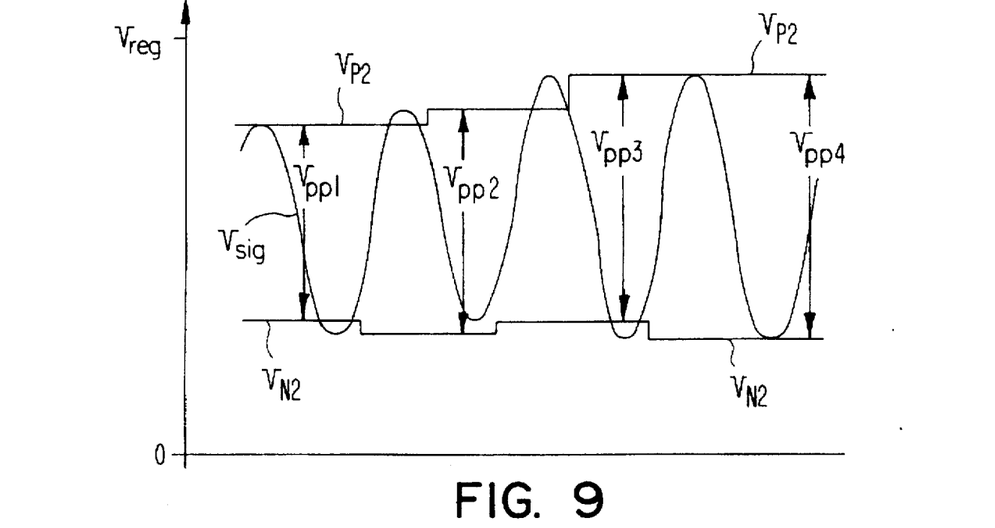
FIG. 9 shows a waveform of the Hall (transducer) voltage signal, during passage of a few magnetic articles, having superimposed thereon the corresponding output signals $V_{P2}$ and $V_{N2}$ from PDAC2 and NDAC2 in the proximity detector of FIG. 1.
Figure 10:
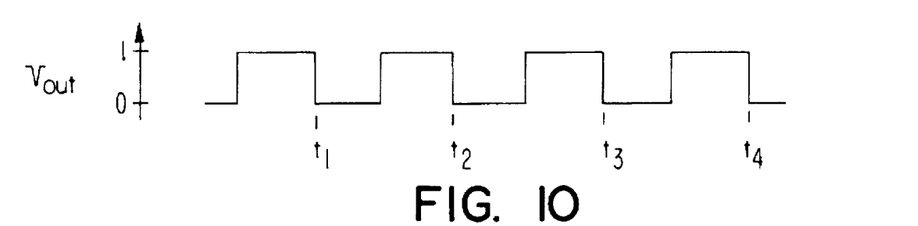
FIG. 10 shows a corresponding waveform of output voltage, Vout, of the proximity-detector of FIG. 1.

The count signals from counters 17 and 27 are also applied, via latches 42 and 52 respectively to PDAC2 44 and NDAC2 54. The P-latch 42 and N-latch 52 are enabled by signals $V_{platch}$ (FIG. 7) and $V_{Nlatch}$ (FIG. 8) from one shot generators 41 and 51 respectively. The one shot generators 41 and 51 are triggered respectively by a low to high transition in the signal Vout and by a high to low transition in Vout (FIG. 4). The output signals $V_{P2}$ and $V_{N2}$ from PDAC2 and NDAC2 are shown in FIG. 9 as they relate to each other and to Vsig, and Vout is drawn to the same scale in FIG. 10.

Now to recapitulate, the output of comparators 24 and 26 go high only when Vsig goes negative. Thus only when Vsig is going negative are there changes of state in the signals of AND gate 25, counter 27, NDAC1 30, latch 52, NDAC2 54, and buffer 58. The upper (P) and lower (N) portions of the circuit share the clock 18, the reset delay circuit 29. Referring to FIG. 3, this tracking of Vsig begins at a time $t_{ppk}$ at which a low to high transition in Vout occurs.

Counters 17 and 27 only count upwardly. It should be noted that the DC reference voltages +Vreg and ground are connected to NDAC1 30 and NDAC2 54 inversely with respect to those connections to PDAC1 20 and PDAC2 44; therefore as the count in counter 27 goes up, the output $V_{N1}$ of the NDAC1 30 goes down as seen in FIG. 3. Alternatively, both of the NDACS 30 and 54 could have been connected to the DC reference voltages as are the PDACs 20 and 44 if the counter 27 had been of the kind that counts down from maximum count. The counters 17 and 27 are of the kind that include an anti-overflow feature that prevents wrapping of the count when maximum count is exceeded.

The signals $V_{P2}$ and $V_{N2}$ are applied via unity gain buffer stages 48 and 58 to the two inputs of a fixed-gain differential amplifier 60. The output signal of amplifier 60, Vpp, is the difference voltage between $V_{P2}$ and $V_{N2}$, which difference voltage is essentially equal to the peak to peak value of Vsig. As Vsig grows, it is tracked by Vpp as seen in FIG. 9.

The signal Vpp is applied to one input of a comparator 62. A reference voltage $V_{TG}$ is applied to the other comparator 62 input. When Vpp exceeds $V_{TG}$ the output signal $V_{toobig}$ of comparator 62 is at a high binary level.

The Hall voltage amplifier 12 includes a fixed-gain amplifier stage 65; a programmable-gain amplifier composed of a digital-to-analog converter G-DAC 67, two resistors 71 and 73, and an operational amplifier 69; and a step-wise adjustable-gain amplifier composed of an operational amplifier 75; three resistors 77, 79 and 81, and a switch 83.

A counter 85 is an up counter which does riot wrap after the maximum count is reached, and has a count output connected to the G-DAC 67. The signal Vout is inverted by invertor 87, and counter 85 counts positive transitions in the inverted signal Vout. G-DAC 67 is connected internally as a digitally programmable resistor having a maximum resistance when the input count to the DAC is zero. The resistor 71 in parallel with the resistance of G-DAC 67 sets the total input resistance to the operational amplifier 69 at its highest value at zero count which sets the gain of the amplifier at its lowest value.

Figure 11:
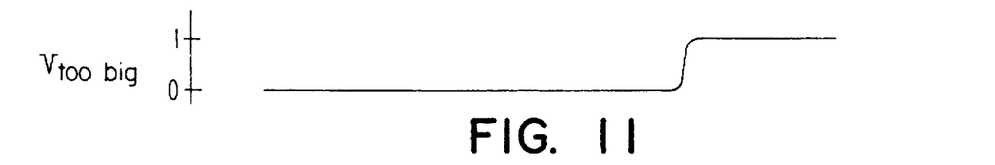
FIG. 11 shows a corresponding output signal waveform of comparator 62, $V_{toobig}$, in the proximity-detector of FIG. 1.
Figure 12:
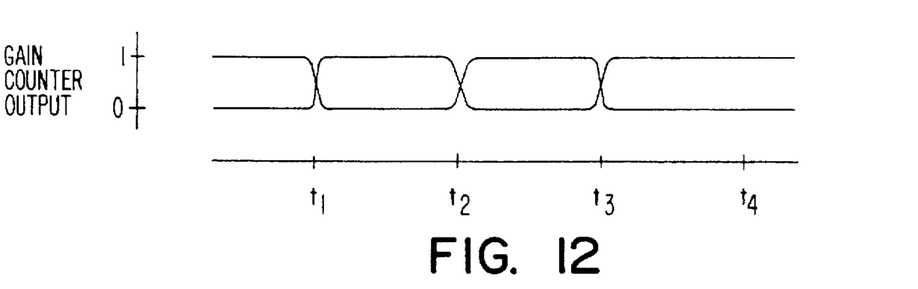
FIG. 12 shows corresponding waveforms of the binary output voltages from the first two bits in gain counter (G-COUNTER) 67 of the proximity-detector of FIG. 1.

When the first positive and negative excursions in Vsig generate a signal Vpp1 (FIG. 9) that is lower than the reference voltage $V_{TG}$, the signal $V_{toobig}$ is low (FIG. 11) and enables counter 85 via inverting NOR gate 89. Counter 85 responds by counting up by one count at the next positive transition in inverted signal Vout as indicated in FIG. 12. This causes a single increment of gain increase, which is illustrated in FIG. 9 wherein Vpp1 grows to Vpp2 and Vsig increases slightly in amplitude in the period from $t_1$ to $t_2$. This process of testing the amplitude of (Vpp and thus Vsig) against a target reference value $V_{TG}$ and adjusting the gain upward one increment when the target has not yet been reached, continues for as many periods in Vsig (and Vout) as is necessary to set the peak to peak amplitude of Vsig to the target value, $V_{TG}$.

When the target value has been reached or exceeded, $V_{toobig}$ goes high (FIG. 11), so the counter 85 being thus disabled does not count further as illustrated in FIG. 12 and the gain of the amplifier remains fixed (e.g. between times $t_3$ and $t_4$ in FIG. 9) thereafter (until the detector has been turned off and started up again).

However, when the first positive and negative excursions in Vsig generate a signal Vpp1 (FIG. 9) that is higher than the reference voltage $V_{TG}$, the signal $V_{toobig}$ is high for disabling counter 85 via inverting NOR gate 89, and holding the D input of the flip flop 91 high. Counter 93 is a serial counter that provides one output at which the signal is low until the counter has counted two (more generally a few) positive excursions in the inverted signal Vout, at which time the invertor 87 output goes high and clocks through the high at the D input of flip flop 91 to the flip flop Q output.

This clocking of a high signal through flip flop 91 occurs when the non inverted signal Vout (FIG. 10) goes low. After the first two periods in Vsig, switch 83 closes to connect feedback resistor 81 which decreases the gain of the amplifier composed of operational amplifier 75 and resistors 77 and 79. For example, the operational amplifier gain may be reduced by a factor of 4, causing the gain of amplifier 12 to be reduced by a factor of 4.

Thus during the first two positive pulses in the transducer voltage Vsig it is determined whether the peak to peak voltage of Vsig ($V_{pp}$) is too big relative to the target reference voltage $V_{TG}$. If it is not too big, the G-counter is enabled (by signal $V_{toobig}$), the resistance of G-DAC 67 immediately begins to fall and the gain of that count-controllable gain stage rises to the target value at which it remains thereafter.

But if during the first two positive pulses in the transducer voltage Vsig (corresponding to the passing of two magnetic articles), it is determined that the peak to peak voltage ($V_{pp}$) of Vsig is too big relative to the target reference voltage $V_{TG}$, then after two pulses in Vsig the overall gain of amplifier 12 is reduced by a factor of 4, and the count-controllable gain stage brings the peak to peak value of Vsig up to the target value.

Counter 93 is a serial up-counter of the kind that does not wrap. It counts up only and is not reset until de-energized and again energized. Counter 93 provides a second serial count output that goes high at the larger count of 16 excursions (pulses) in Vsig (or Vout). The x16 output is low until the count 16 has been reached. A high output signal from the x16 output of counter 93 at the count of 16 disables the G-counter 85 to limit how many (e.g. 16) periods in Vsig (e.g. negative going excursions in Vsig and/or Vout) may be counted by the G-counter 85 to adjust the gain. Alternatively, the counting of positive going excursions would be equally effective.

The purpose of effecting automatic gain adjustment, for only a few of the first pulses in Vsig following turning on the supply voltage +Vreg and starting the detection of passing articles, is to obtain optimum transducer-voltage amplifier gain for the conditions at starting and to maintain constant gain thereafter in order to avoid incremental shifts in the actual distance of approaching articles at which a corresponding transition in Vout occurs. When gain changes take place continuously frequent shifts in detection approach distance cause jitter in the Vout transitions.

In the above described embodiment, the gain of amplifier 12 is adjusted during the first 16 periods in Vsig (corresponding to the passage of the first 16 magnetic articles) and thereafter held fixed, providing a fast initial gain adjustment after which no further adjustments are made. This feature is particularly suitable in a proximity detector for use in a combustion engine ignition system, wherein all the adjustments in gain occur only during crank start of the engine. During the subsequent loading and running of the engine it is desired to avoid any changes in ignition timing that would occur as a result of changes in the amplitude of Vsig, and thus gain adjust is completed just at start.

To summarize, after just two articles have passed it is determined whether the signal is too big and if so the gain of amplifier 12 is reduced by a large factor, namely in this example by a factor of 4. And during passage of the following 16 articles, the gain is adjusted upward based upon the greatest of the peak amplitudes in the transducer signal $V_H$, so that greatest peak amplitude is at a predetermined target value. This target amplitude is just inside the dynamic range of the amplifier 12, avoiding clipping of the signal while at the same time providing a large signal Vsig with peaks just under the target value $V_{TG}$ for enhancing accurate detection.

Figure 13:
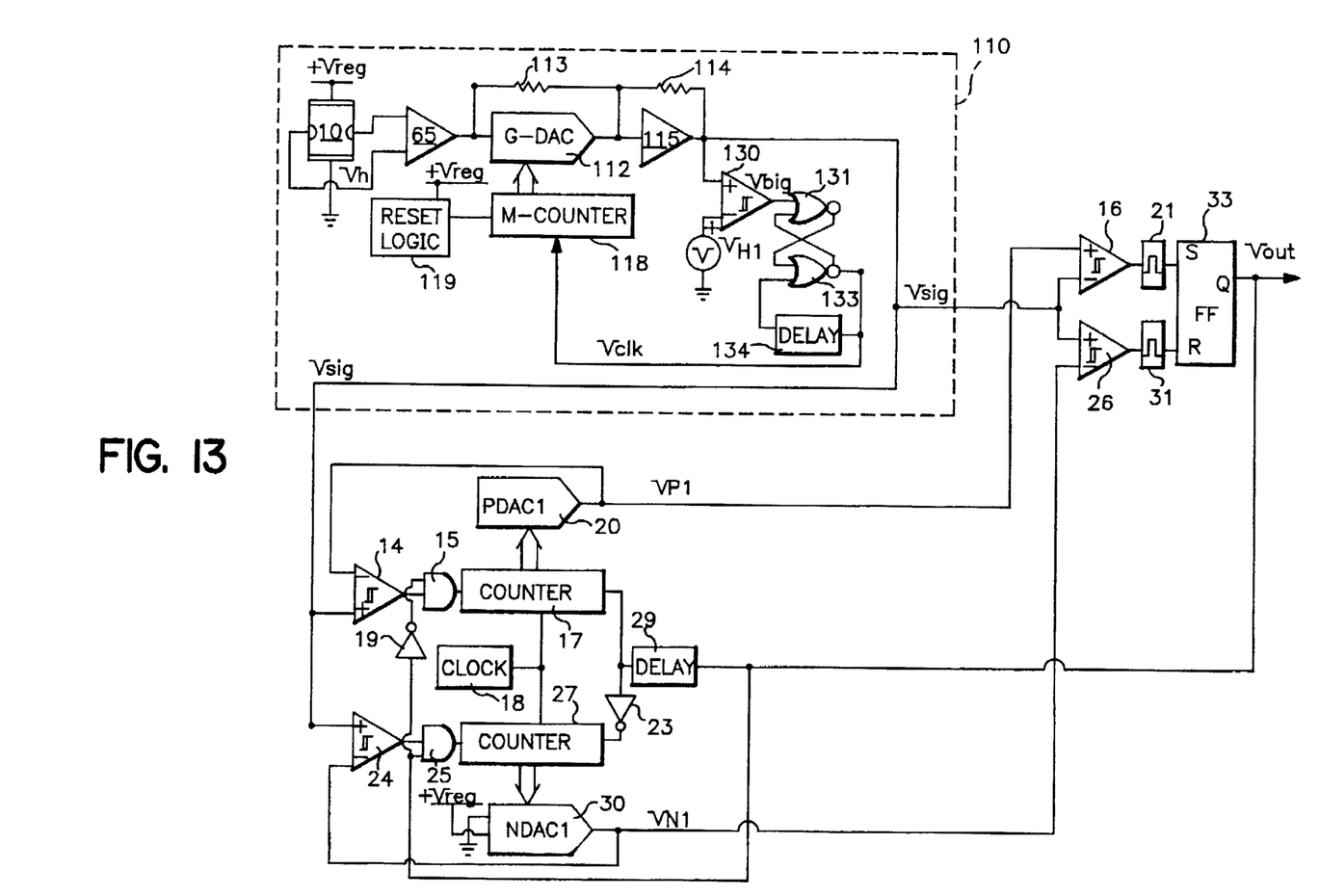
FIG. 13 shows a block diagram of a second magnetic-article proximity detector of this invention.

Referring to the second embodiment of a gain controlled proximity detector in FIG. 13, the output of the Hall transducer 10 is connected to the fixed-gain Hall voltage amplifier 65 which is in turn connected to the input of a digitally controllable gain stage composed of a digital-to-analog converter G-DAC 112, two resistors 113 and 114, and an operational amplifier 115.

The counter 118 is a down counter which is reset to its maximum count by logic block 119 only when the proximity detector is started, namely when +Vreg is turned on. Counter 118 does not wrap after the unlikely event that the count has reached zero. The positive going transitions in clock signal Vclk correspond respectively to passage of magnetic articles by the transducer 10 as will be further described. G-DAC 112 is connected internally as a digitally programmable resistor having a maximum resistance when the input count to the DAC is zero. This G-DAC resistor in parallel with resistor 113 sets the total input resistance $R_{in}$ to the operational amplifier 69 at its highest value when the counter 118 is at maximum count. The gain of this digitally controlled amplifier is $R_{114}/R_{in}$, and at maximum count when $R_{in}$ is at its minimum value the amplifier gain is the greatest.

Figure 14:
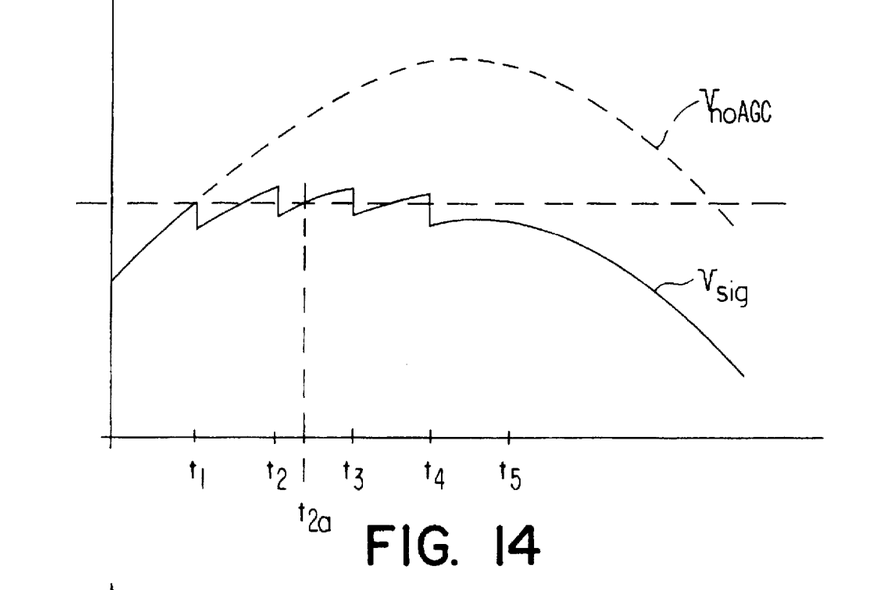
FIG. 14 shows the waveform of a positive peak portion of Vsig during which automatic gain control (AGC) is effected.

The amplified Hall voltage Vsig is applied to one input of comparator 130 and a DC reference voltage $V_{HI}$ is connected to the other input of comparator 130. When as illustrated in FIG. 14, a positive excursion in Vsig reaches the reference voltage $V_{VI}$, the signal $V_{big}$ (FIG. 15) at the output of comparator 130 goes high at time $t_1$. This causes the output Vclk (FIG. 16) of the latch of cross-coupled NOR gates 131 and 133 to go high, and the count in counter 118 decreases by one. Thus at $t_1$ the resistance of G-DAC 112 goes up by an incremental amount, the gain of amplifier 110 decreases by a corresponding incremental amount and there is an incremental drop in the voltage Vsig that occurs at time $t_1$.

Figure 15:
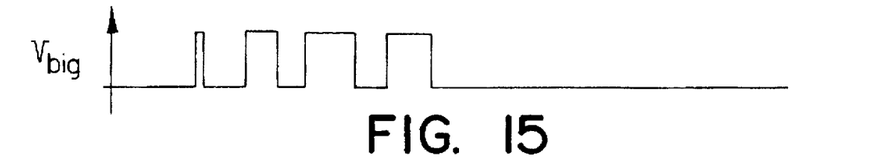
FIG. 15 shows a waveform of the binary signal Vbig in the AGC circuit.
Figure 16:
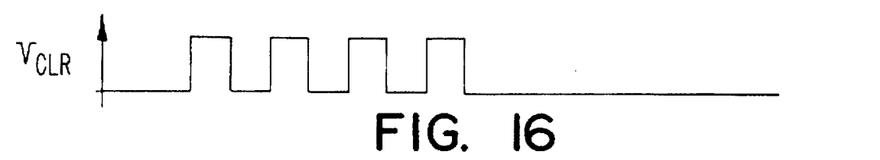
FIG. 16 shows the waveform of the binary signal Vclk in the AGC circuit.
Figure 17:
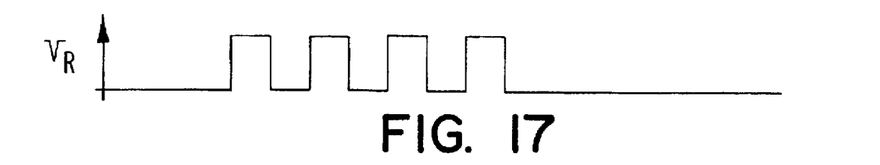
FIG. 17 shows the waveform of the binary signal $V_R$ in the AGC circuit.

But the incremental drop in Vsig at $t_1$ puts the amplitude of Vsig below $V_{HI}$ and Vbig almost instantaneously goes low as illustrated in FIG. 15. Thus there is only a narrow high spike in the signal Vbig at $t_1$ as seen in FIG. 15. The signal Vclk passes through the delay circuit 134 (e.g. a 5 μsec delay), and at 5 μsec after $t_1$ the reset input signal $V_R$ (FIG. 17) to NOR gate 133 goes high to reset the NOR gates latch.

Because the gain in amplifier 110 has dropped at $t_1$, Vsig is amplified less after $t_1$. When Vsig again reaches $V_{HI}$, Vbig goes high But the high in $V_R$ (FIG. 17) holds the latch reset until $t_2$, at which time the high in Vbig can set the latch again and drop the gain of the amplifier 110 a second time. This sequence of events is repeated until at time $t_4$, Vsig remains below the reference voltage $V_{HI}$. The dashed curve $V_{noAGC}$ in FIG. 14 shows the waveform of the excursion of Vsig that would have occurred if the gain of the amplifier 110 had remained constant, i.e. there had been no automatic gain control.

Figure 18:
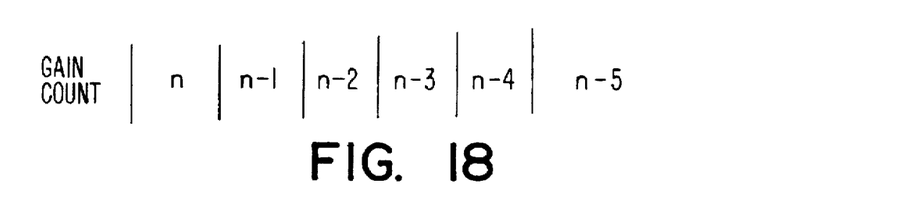
FIG. 18 shows the count in counter 118 which sets the gain of amplifier 110 for successive intervals during automatic gain control.

In FIG. 18, n is the gain setting count in counter 118 prior to time $t_1$. Successive counts (n-1) through (n-5) decrease leading to successive decreases in amplifier gain. If the following positive peaks in transducer signal $V_H$ remain the same, the gain setting count in counter 118 will drop very little more if any. It can therefore be appreciated that AGC action will have been substantially terminated during appearance of the very first positive excursion in Vsig after energizing the proximity detector.

This also illustrates the ability of the detector of FIG. 13 to count passing magnetic articles down to zero speeds and simultaneously obtain effective AGC action and the corresponding advantage of high detection accuracy from the very first positive excursion in Vsig.

Figure 19:
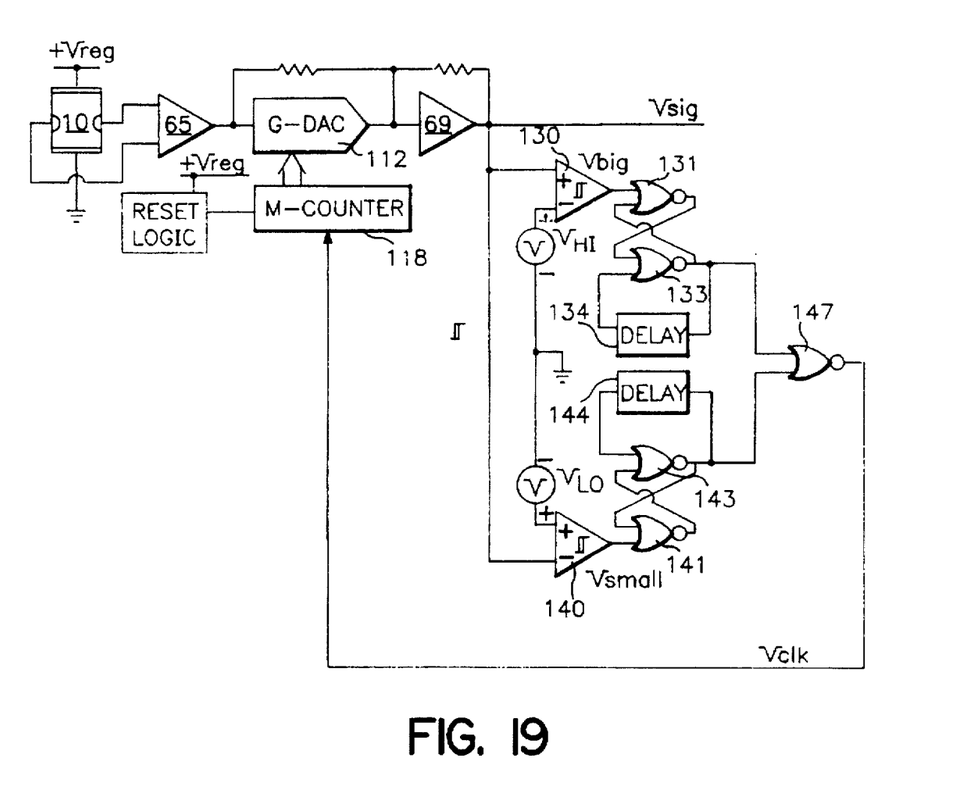
FIG. 19 shows a block diagram of an alternative AGC circuit to that employed in the proximity detector of FIG. 13.

The detector of FIG. 19 consists of the detector of FIG. 13 with the addition of automatic gain control of a negative going excursion in Vsig. Considering that the detector of FIG. 13 controls the gain of Vsig and therefore the amplitude of positive and negative peaks therein, and considering that it is not uncommon that magnetic-field-to-voltage transducers produce asymmetrical waveforms in $V_H$, it will be appreciated that it is possible in the detector of FIG. 13, with AGC based on positive peaks only in Vsig, that negative peaks would be clipped.

The AGC circuit is expanded in FIG. 19 to additionally include a comparator 140, a new fixed DC reference voltage generator $V_{LO}$, another latch of cross-coupled NOR gates 141 and 143 and another delay circuit 144.

These additional components are to provide complementary treatment of gain adjust referenced to the negative going excursions in Vsig. The added NOR gate 147 has inputs connected to the outputs of the two cross-coupled latches and produces a composite clock signal Vclk that is applied to the input of the down counter 118. Now if the first positive excursion in Vsig is greater than $V_{HI}$, the gain is adjusted downward. If a subsequent negative going excursion in Vsig is still less than $V_{LO}$, the gain is downward adjusted so that the peaks of both polarities in Vsig are within the range of from $V_{LO}$ to $V_{HI}$, and asymmetrical waveforms in $V_H$ of any extreme are quickly brought within the dynamic operating range of the amplifier by the AGC circuit of FIG. 19.

Figure 20:
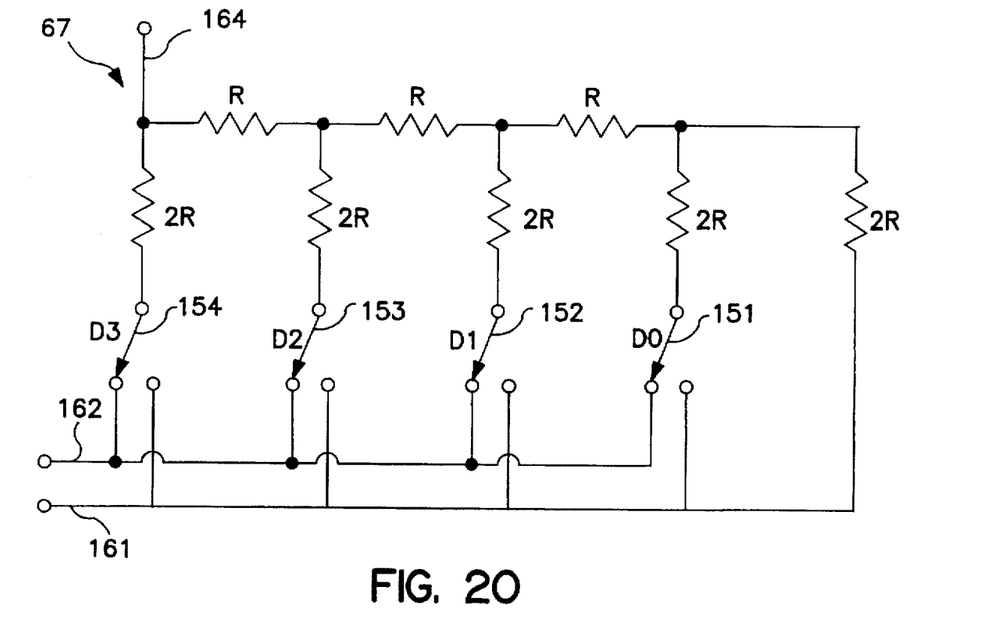
FIG. 20 shows a circuit diagram of an R/2R digital-to-analog converter (DAC).
Figure 21:
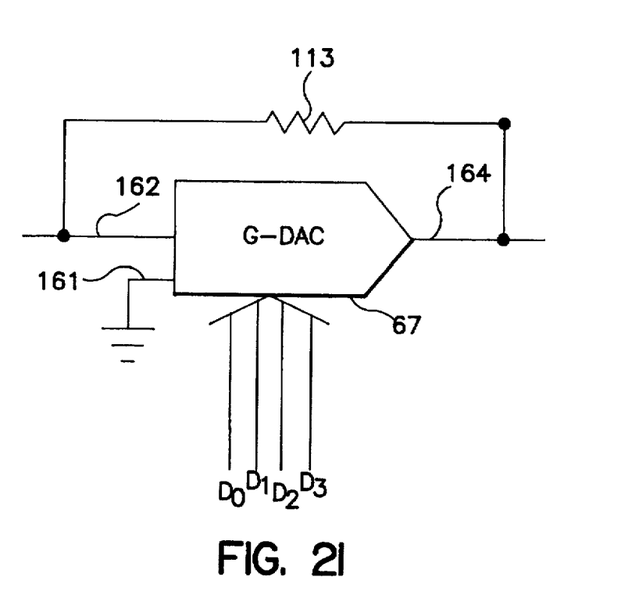
FIG. 21 shows a block diagram 67 of the DAC of FIG. 20 connected as a digitally controllable resistor, such as may be employed as the G-DAC 85 in FIGS. 1 and 19, and as the G-DAC 112 in FIG. 13.

The DACs 67 and 112 in FIGS. 1, 13 and 19 serve essentially as digitally-controllable resistors, and may employ the well known 2R/R type DACs connected as shown in FIG. 20. Each of the three resistors shown at the top of FIG. 20 has a resistance R, while the other four resistors have a resistance of 2R. The corresponding external leads of DAC 67 are shown both in the full circuit of FIG. 20 and the block diagrammed DAC 67 in FIG. 21.

A lead 161 is grounded while leads 162 and 164 are connected respectively to the output of the first Hall-voltage amplifier 65 and to the input of the operational amplifier 69. The four switches 151, 152, 153 and 154 represent electronic switches to which are connected the four digit count signal $D_0$, $D_1$, $D_2$ and $D_3$ from the gain counter (e.g. 85). Switches 151, 152, 153 and 154 are shown in the positions wherein all four digits in the input count signal are high and the resistance between leads 162 and 164 is at a minimum value. The paralleling resistor 113 is not essential. Resistor 113 drops the minimum resistance of the paralleled combination at the input of the operational amplifier but more importantly reduces the maximum operational amplifier input resistance, i.e. maximum $R_{in}$.

When grounded the G-DACs become digitally-controllable voltage dividers, and the effective resistance between conductors 162 and 164 becomes essentially a linear function of the digital count to the G-DAC 67 when R is large enough that the resistance between terminals 161 and 162 is much larger than the output impedance of the Hall-voltage amplifier 65. Thus amplifier gain is a linear funtion of the count.

Many variations in the proximity detectors of this invention are now evident, some of which are as follows.

It will be recognized that during the tracking by $V_{P1}$ of positive slope portions of Vsig by the proximity detector of FIG. 1, the comparator 14, clock 18, counter 17 and PDAC1 20 serve together as a generator of a digital signal, namely the digital count signal at the output of the counter 17, that is tracking Vsig. This digital signal generator is a digitizer of the analog signal Vsig, or is an analog-to-digital convertor. Likewise during tracking by $V_{N1}$, comparator 24, clock 18, counter 27 and NDAC1 30 serve together as an analog-to-digital convertor producing a digital signal, namely the digital count signal at the output of the counter 27, that tracks negative going portions of Vsig. These remarks apply to FIG. 13 as well. In proximity detectors of this invention, digital-to-analog convertors may be formed by circuit means other than those shown here.

For example, the digitally-gain-controllable amplifiers based upon use of G-DACs 67 and 112 may alternatively be based upon prior art digitally-gain-controlled amplifiers wherein there is substituted for the G-DAC a group of parallel connected branch circuits, each containing a resistor and a binary-signal controllable switch.

It is further possible to employ just one up-down counter (instead of the up counters 17 and 27) that would count up and down in response to a high binary signal respectively from comparators 14 and 24. In this case only one DAC, e.g. PDAC1 20, may be used with the output connected to the positive and negative inputs respectively of comparators 16 and 26. The circuit portion in FIG. 1 for generating the signal $V_{toobig}$ may then be modified by connecting the up-down counter output to both latches 42 and 52, and enabling these latches during up counting and down counting respectively, e.g. using the signal Vout as a latches enabling signal.

As noted, the purpose of effecting automatic gain adjustment, only a few of the first pulses in Vsig to avoid incremental shifts in the actual distance of approaching articles at which a corresponding transition in Vout occurs.

In applications such as ignition distributors, the timing of engine firing tends to cause small but annoying jumps in engine power delivery. However, when detection accuracy is an overriding consideration, it is easily possible to periodically reset counter 93 (FIG. 1) or 118 (FIG. 13) to permit infrequent readjustments in gain, e.g. every minute or so, or after predetermined number of detected articles have passed by.

Of course continuous gain adjustment is another option, e.g. accomplished in the detector of FIG. 1 by removing the NOR gate 89 and connecting the Vtoobig signal directly to the enable input of the counter 85.

The Hall-amplifier output voltage Vsig may be considered a magnetic-field-to-voltage transducer output, which transducer includes the Hall element. The above-described AGC is effected by controlling the gain of a digitally controlled Hall-amplifier that may be considered part of a transducer. Alternatively, it is possible to digitally control the exciting current in the Hail element for effecting AGC of the composite transducer, e.g. by using a digitally controlled voltage regulator that is used for energizing the Hall element.

It has been found through computer generated models, that proximity detectors of the kind described in the above-mentioned co-filed patent application Ser. No. 08/587,405 entitled DETECTION OF PASSING MAGNETIC ARTICLES AT SPEEDS DOWN TO ZERO may advantageously be merged with those of the kind described in another co-filed patent application Ser. No. 08/587,407 entitled DETECTION OF PASSING MAGNETIC ARTICLES WHILE PERIODICALLY ADAPTING DETECTION THRESHOLDS TO CHANGING AMPLITUDES OF THE MAGNETIC FIELD. That application describes similar portions of a proximity detector circuit and operation in greater detail and is incorporated by reference herein.

Labeling these two kinds of proximity detectors respectively as "slope-activated" and "threshold" proximity detectors, a slope-activated detector was advantageously merged in a computer modeling simulation with a threshold detector so that the slope-activated detector, which is capable of operation down to zero speeds. In the model, the merged detector became operative in the slope-activated mode for a short initial interval after starting, after which it automatically went into the threshold detection mode.

Furthermore the automatic gain control feature, that is the subject of this invention and is capable of operation down to zero speeds, was incorporated with the slope-activated detector for only initially setting the gain and the level of Vsig. Automatic gain control was thereafter discontinued to avoid further step-function gain shifts which tend to cause jitter and instability in the detection distances of magnetic article approach and departure. The method of automatic gain control of this invention is especially well suited for such initial use in a merged proximity detector because of its rapid gain adjustment and its undiminished detection efficacy at very low speeds.

We claim:

1. A proximity-detection method for detection of passing magnetic articles comprising:
    a) employing a digitally gain-controlled magnetic-field-to-voltage transducer, sensing an ambient magnetic field and generating a voltage, Vsig, having an amplitude that is directly related to the magnetic field;
    b) comparing the amplitudes of the excursions of at least one polarity in Vsig to a predetermined target value;
    c) generating a binary signal Vbig that changes from one to another binary level each time that Vsig exceeds the target value;
    d) applying the binary signal to the digitally-gain-controlled transducer and when Vbig changes from the one to another binary level changing the gain of the digitally-gain-controlled transducer by one predetermined gain increment in the direction to bring the peak values in Vsig to below the predetermined target value; and
    e) generating a binary proximity-detector output voltage Vout having transitions of one polarity each time excursions of one polarity in Vsig reach a predetermined point therein.

2. A proximity-detection method for detection of passing magnetic articles comprising:
    a) sensing an ambient magnetic field and generating a voltage, $V_H$, having an amplitude that is directly related to the magnetic field;
    b) amplifying the voltage $V_H$ in a digitally-gain-controlled amplifier to generate the amplified signal Vsig;
    c) comparing the amplitudes of the excursions of at least one polarity in Vsig to a predetermined target value;
    d) generating a binary signal Vbig that changes from one to another binary level each time that Vsig exceeds the target value;
    e) applying the binary signal to the digitally-gain-controlled amplifier and when Vbig changes from the one to another binary level changing the gain of the digitally-gain-controlled amplifier by one predetermined gain increment in the direction to bring the peak values in Vsig to below the predetermined target value; and
    f) generating a binary proximity-detector output voltage Vout having transitions of one polarity each time excursions of one polarity in Vsig reach a predetermined point therein.

3. The proximity-detection method of claim 2 wherein each incremental change in gain is a fixed predetermined increment of gain change.

4. The proximity-detection method of claim 2 wherein the repeatedly comparing the amplitudes of the excursions of at least one polarity in Vsig, and the generating a digital signal for incrementally changing the gain of the digitally-gain-controlled amplifier, are only effected for one initial predetermined time interval.

5. The proximity-detection method of claim 4 additionally comprising counting the excursions of at least one polarity and terminating the one initial predetermined time interval when the count reaches a predetermined number.

6. The proximity-detection method of claim 2 additionally comprising counting the transitions of at least one polarity in Vout, the repeatedly comparing the amplitudes of the excursions of at least one polarity in Vsig and the generating a digital signal for incrementally changing the gain of the digitally-gain-controlled amplifier being effected only for one interval that terminates when the counted number of transitions in Vout reaches a predetermined number.

7. A proximity-detection method for deteckion of passing magnetic articles comprising:
    a) sensing an ambient magnetic field and generating a voltage, Vsig, having an amplitude that is directly related to the magnetic field;
    b) generating a digital signal corresponding to the analog voltage Vsig during positive-going slope portions of Vsig;
    c) applying the digital signal to the input of a digital-to-analog convertor (PDAC) for generating an analog signal $V_{P1}$ that tracks the positive slopes and holds the positive peak values of Vsig;

d) generating a digital signal corresponding to the voltage Vsig during negative-going slope portions of Vsig;

e) applying the digital signal to the input of a digital-to-analog convertor (NDAC) for generating an analog signal $V_{N1}$ that tracks the negative slopes and holds the negative peak values of Vsig;

f) generating a proximity-detector output voltage Vout that changes binary state in one direction when at times $t_{ppk}$, Vsig recedes from the held positive peak voltage in signal $V_{P1}$ by a predetermined voltage Vhys, and that changes binary state in the other direction when at times $t_{npk}$, Vsig recedes from the held negative peak voltage in signal $V_{N1}$ by a predetermined voltage Vhys; and g) the sensing of an ambient magnetic field and the generating a voltage Vsig comprising:

employing a magnetic-field-to-voltage transducer and amplifying the transducer voltage in a digitally-gain-controlled amplifier to generate Vsig; and upon starting the sensing, repeatedly comparing the amplitudes of an excursion of at least one polarity in Vsig to a predetermined target value and generating a binary signal $V_{toobig}$ having a transition from one binary level to another when Vsig exceeds the target value, applying the binary signal to the amplifier and at each of the transitions therein incrementally changing the gain of the digitally-gain-controlled amplifier in the direction to bring the peak values in the excursion of Vsig to below the predetermined target value.

8. A slope-activated proximity detector of passing magnetic articles comprising:

a) sensing means for sensing an ambient magnetic field and generating a voltage, Vsig, having an amplitude that is directly related to the magnetic field;

b) positive digitizing means connected to said sensing means for generating a digital output signal corresponding to the analog voltage Vsig during positive-going slope portions of Vsig;

c) a digital-to-analog convertor (PDAC), having an input connected to the output of said positive digitizing means, for generating an analog output signal $V_{P1}$ that tracks the positive slopes and holds the positive peak values of Vsig;

d) negative digitizing means connected to said sensing means for generating a digital output signal corresponding to the analog voltage Vsig during negative-going slope portions of Vsig;

e) a digital-to-analog convertor (NDAC), having an input connected to the output of said negative digitizing means, for generating an analog output signal $V_{N1}$ that tracks the negative slopes and holds the negative peak values of Vsig;

f) means for generating a proximity-detector output voltage Vout that changes binary state in one direction when at times $t_{ppk}$, Vsig recedes from the held positive peak voltage in signal $V_{P1}$ by a predetermined incremental voltage Vhys, and that changes binary state in the other direction when at times $t_{npk}$, Vsig recedes from the held negative peak voltage in signal $V_{N1}$ by a predetermined incremental voltage Vhys;

g) said sensing means including:

a magnetic-field-to-voltage transducer;

a digitally-gain-controlled transducer-voltage amplifier connected to said transducer, for generating an output voltage Vsig that is directly related to the transducer voltage; and a comparator means connected to said transducer-voltage amplifier for after starting the sensing, repeatedly comparing the amplitudes of the excursions of at least one polarity in Vsig to a predetermined target value and generating a digital signal for incrementally changing the gain of the digitally-gain-controlled amplifier in the direction to bring the peak values in Vsig to just below the predetermined target value.

9. A proximity detector of passing magnetic articles comprising:

a) a magnetic-field-to-voltage transducer for sensing an ambient magnetic field and generating a voltage, $V_H$, having an amplitude that is directly related to the magnetic field;

b) a digitally gain-controlled amplifier connected to said transducer for amplifying $V_H$ and producing the amplified signal Vsig;

c) a DC voltage source for generating a target-voltage $V_{TG}$;

d) a comparator means having inputs connected to the output of said amplifier and to said DC voltage source for generating a binary signal Vbig that changes from one to another binary level each time that Vsig exceeds $V_{TG}$;

e) detector means connected to the output of said amplifier for generating a proximity-detector output voltage, Vout, having transitions of one polarity each time excursions of the one polarity in Vsig reach a predetermined point therein.

f) circuit means connected to the output of said transducer for sensing and counting excursions of the one polarity in Vsig, and producing a binary count output signal, the output of said circuit means connected to said amplifier for at each of the counted excursions in Vsig, incrementally changing the transducer gain in the direction to bring the peaks in Vsig to below the target value $T_{TG}$.

* * * * *